(12) United States Patent
Lee et al.

(10) Patent No.: US 6,699,625 B2
(45) Date of Patent: Mar. 2, 2004

(54) REFLECTION PHOTOMASKS INCLUDING BUFFER LAYER COMPRISING GROUP VIII METAL, AND METHODS OF FABRICATING AND USING THE SAME

(75) Inventors: Byoung-taek Lee, Seoul (KR); Taro Ogawa, Tokyo (JP); Biichi Hoshino, Kanagawa (JP)

(73) Assignee: Samsung Electronics Co., Ltd. (KR)

( * ) Notice: Subject to any disclaimer, the term of this patent is extended or adjusted under 35 U.S.C. 154(b) by 197 days.

(21) Appl. No.: 09/976,566

(22) Filed: Oct. 12, 2001

(65) Prior Publication Data

US 2002/0045108 A1 Apr. 18, 2002

(30) Foreign Application Priority Data

Oct. 13, 2000 (JP) ........................................ 2000-314292

(51) Int. Cl.[7] ................................................. G03F 9/00
(52) U.S. Cl. ............................................................. 430/5
(58) Field of Search ...................... 430/5, 322; 378/34, 378/35

(56) References Cited

U.S. PATENT DOCUMENTS 5,272,744 A * 12/1993 Itou et al. ..................... 378/35
6,319,635 B1 * 11/2001 Mirkarimi et al. ............. 430/5

OTHER PUBLICATIONS

Mangat et al., *EUV Mask Fabrication With Cr Absorber*, Proceedings of the SPIE, vol. 3997, Jul. 2000, pp. 76–82.
Hoshino et al., *Process Scheme for Removing Buffer Layer on Multilayer for EUVL Mask*, Proceedings of the SPIE, vol. 4066, Jul. 2000, pp. 124–130.

* cited by examiner

*Primary Examiner*—S. Rosasco
(74) *Attorney, Agent, or Firm*—Myers Bigel Sibley & Sajovec

(57) ABSTRACT

Reflection photomasks add a buffer layer including at least one Group VIII metal between a reflection layer and an absorber pattern that is configured to absorb extreme ultraviolet rays therein. In particular, reflection photomasks include a substrate and a reflection layer having multiple sets of alternating films of first and second materials, on the substrate. A buffer layer including at least one Group VIII metal is provided on the reflection layer opposite the substrate. An absorber pattern including material that is patterned in a pattern and that is configured to absorb extreme ultraviolet rays, is provided on the buffer layer opposite the reflection layer. The at least one Group VIII metal preferably is Ru. At least a portion of the Ru buffer layer may be less than about 3 nm thick. Alternatively, the Group VIII metal can include Pt, Ir and/or Pd.

56 Claims, 12 Drawing Sheets

REFLECTION PHOTOMASKS INCLUDING BUFFER LAYER COMPRISING GROUP VIII METAL, AND METHODS OF FABRICATING AND USING THE SAME

RELATED APPLICATIONS

This application claims the benefit of Japanese Patent Application No. 2000–314292, filed Oct. 13, 2000, the disclosure of which is hereby incorporated herein by reference in its entirety as if set forth fully herein.

FIELD OF THE INVENTION

This invention relates to reflection photomasks that are used for integrated circuit manufacturing, and more particularly to reflection photomasks that are used with extreme ultraviolet radiation for integrated circuit manufacturing and methods of manufacturing and using the same.

BACKGROUND OF THE INVENTION

As integration densities of integrated circuit devices continue to increase, it may become increasingly difficult to fabricate fine linewidths using conventional photomasks. Thus, for example, exposure of a pattern size of about 250 nm may be performed using Deep UltraViolet (DUV) radiation at, for example, 248 nm. Moreover, other DUV technologies, which can use a radiation source of shorter wavelength than about 193 nm, can decrease the pattern size to between about 100 and about 130 nm. In order to expose pattern sizes of less than about 100 nm, for example pattern sizes of about 5 to about 70 nm, exposure wavelengths in the Extreme UltraViolet (EUV) region, also referred to as the "soft X-ray region", may be used. EUV radiation may cover wavelengths of between about 10 nm to about 14 nm, for example about 13.4 run to about 13.5 nm.

EUV exposure may use a reflection photomask in contrast with conventional transmission photomasks, since many materials may have a large optical absorptivity in the EUV region. In general, an EUV reflection photomask may be obtained by forming a pattern in an absorber, which can absorb EUV radiation, on a reflection mirror having large reflectivity in the EUV region. Thus, the regions in which the surface of the reflection mirror is covered with the absorber pattern become absorption regions, and the regions in which the surface of the reflection mirror is exposed become reflection regions. The reflection layer generally comprises a plurality of alternating films comprising first and second materials, such as Mo/Si and/or Be/Si.

FIG. 11 shows an embodiment of a conventional reflection photomask 110. A reflection layer 112 comprising a multi-layer film is formed on a substrate 111 such as a silicon and/or glass substrate. An absorber pattern 113 for EUV rays which comprises, for example, a TaN film having a predetermined pattern, is formed on the reflection layer 112.

However, when directly forming the absorber pattern 113 on the reflection layer 112, as shown in FIG. 11, the exposed portion of the surface of the reflection layer 112 may be etched and/or damaged, during patterning (etching) of the absorber. This damage may reduce the reflectivity.

As shown in FIG. 16, the above defects may be reduced or eliminated using Focused Ion Beams (FIB). For example, in FIG. 16, an etching residue portion 113*a* in the absorber pattern at the left side and a damaged portion 113*b* in an adjacent absorber pattern may be generated during patterning of the absorber pattern 113. FIB can locally remove only the residue portion 113*a* by an etching operation. The damaged portion 113*b* of the pattern also may be locally traced by the absorber and buried by irradiating the FIB at a predetermined gas atmosphere. This process often is referred to as a mask repair process. Unfortunately, however, in the structure shown in FIG. 11, the FIB irradiation itself can damage the surface of the reflection layer during the mask repair process.

Damage can be reduced when patterning the absorber as described in Hoshino et al., *Process Scheme for Removing Buffer Layer on Multilayer for EUVL Mask*, Proceedings of the SPIE, Vol. 4066, July 2000, pp. 124–130, the disclosure of which is hereby incorporated herein by reference in its entirety as if set forth fully herein. For example, as shown in FIG. 12 herein, a buffer layer 123 comprising an $SiO_x$ film is formed under an absorber pattern 124 in a photomask 120. When the photomask 120 is manufactured, a reflection layer 122 comprising a multi-layer film is formed on a substrate 121, as shown in FIG. 13A. A buffer layer 123*a* is formed on the reflection layer 122, as shown in FIG. 13B. An absorber layer 124*a* is formed on the buffer layer 123*a*, as shown in FIG. 13C.

As shown in FIG. 13D, the absorber pattern 124 is formed by patterning the absorber layer 124*a* by photolithography. A two stage etching method is used for patterning. First, dry etching is performed. In particular, the buffer layer 123*a* is etched after the absorber layer 124*a*, as shown in FIG. 13E. Etching is stopped in a state where the buffer layer 123*a* still remains. Wet etching is then performed. In particular, the surface of the reflection layer 122 is exposed by completely removing the remaining buffer layer 123*a*, as shown in FIG. 13F. Accordingly, it is possible to reduce the amount of over-etching of the surface of the reflection layer by using a wet etching process having etching selectivity higher than that of the dry etching.

Damage also can be reduced when pattering the absorber as described in Mangat et al., *EUV Mask Fabrication With Cr Absorber*, Proceedings of the SPIE, Vol. 3997, July 2000, pp. 76–82, the disclosure of which is hereby incorporated herein by reference in its entirety as if set forth fully herein. For example, as shown in FIG. 14 herein, in a photomask 140, a buffer layer 144 comprising an SiON film is formed under an absorber pattern 145. Furthermore, an etch stop layer 143, comprising a Cr film of about 10 nm in thickness, is formed under the buffer layer 144. When the photomask 140 is manufactured, a reflection layer 142 comprising a multi-layer film is formed on a substrate 141, as shown in FIG. 15A. An etch stop layer 143*a* is formed on the reflection layer 142, as shown in FIG. 15B. A buffer layer 144*a* is formed on the etch stop layer 143*a*, as shown in FIG. 15C. An absorber layer 145*a* is further formed on the buffer layer 144*a*, as shown in FIG. 15D.

After forming the absorber pattern 145 by patterning the absorber layer 145*a* by photolithography, as shown in FIG. 15E, the buffer layer 144*a* is etched, as shown in FIG. 15F. Since the etching selectivity of the SiON film can be high with respect to Cr, etching of the buffer layer 144*a* can stop at the surface of the etch stop layer 143*a*. As shown in FIG. 15G, the surface of the reflection layer 142 is exposed by removing the etch stop layer 143*a*. Accordingly, the surface of the reflection layer may not be over-etched during etching of the buffer layer by using the etch stop layer.

Unfortunately, the Hoshino et al. technique may use a complicated two-stage etching. It may be difficult to control the dry/wet etching process and the surface of the reflection layer may be damaged.

Moreover, the Mangat et al. technique also may complicate fabrication due to the etch stop layer. It may be possible to prevent the surface of the reflection layer from being over-etched during etching of the buffer layer by forming the etch stop layer. However, the surface of the reflection layer may be over-etched when the etch stop layer is removed subsequently. For example, when the etch stop layer comprising Cr remains on the reflection region, the etch stop layer may need to be removed since the optical absorptivity of the Cr film is strong and reflection on the surface of the reflection layer may be reduced. However, since etching selectivity of Cr with respect to the surface of the reflection layer may be low, the surface of the reflection layer may be over-etched.

SUMMARY OF THE INVENTION

Reflection photomasks, according to some embodiments of the invention, add a buffer layer comprising at least one Group VIII metal between the reflection layer and the absorber pattern that is configured to absorb extreme ultraviolet rays therein. In particular, some embodiments of reflection photomasks according to the invention include a substrate and a reflection layer comprising a plurality of alternating films comprising first and second materials, respectively, on the substrate. A buffer layer comprising at least one Group VIII metal is provided on the reflection layer opposite the substrate. An absorber pattern comprising material that is patterned in a predetermined pattern and that is configured to absorb extreme ultraviolet rays therein, is provided on the buffer layer opposite the reflection layer. In some embodiments, the at least one Group VIII metal comprises Ru and, in other embodiments, at least a portion of the buffer layer comprising Ru is less than about 3 nm thick. In still other embodiments, the Group VIII metal comprises at least one of Pt, Ir and Pd. Moreover, in some embodiments, the first and second materials may comprise Mo and Si.

Other embodiments of the invention include a stress relaxing layer between the substrate and the reflection layer. The stress relaxing layer can offset or reduce the compressive or tensile stress that is created in the reflection layer, and thereby reduce or eliminate curving of the reflection photomask.

In some embodiments, the predetermined pattern comprises first regions comprising the material that is configured to absorb extreme ultraviolet rays therein, and second regions that are free of the material that is configured to absorb extreme ultraviolet rays therein. In other embodiments, the buffer layer is thinner beneath the second regions than beneath the first regions. In yet other embodiments, the buffer layer comprises a patterned buffer layer that is patterned in the predetermined pattern. In still other embodiments, the buffer layer is a first buffer layer and the reflection photomask further comprises a second buffer layer between the first buffer layer and the absorber pattern, and that is patterned in the predetermined pattern. The first buffer layer can be thinner beneath the second regions than beneath the first regions.

Reflection photomasks may be fabricated, according to embodiments of the invention, by forming a plurality of alternating films comprising first and second materials on a substrate. A layer comprising at least one Group VIII metal is formed on the plurality of alternating films comprising first and second materials, opposite the substrate. A layer comprising material that is configured to absorb extreme ultraviolet rays therein is formed on the layer comprising at least one Group VIII metal, opposite the plurality of alternating films comprising first and second materials. Finally, the layer comprising material that is configured to absorb extreme ultraviolet rays is patterned. The composition and thickness of these regions may be as was described above. Moreover, in some embodiments, the layer comprising at least one Group VIII metal also is patterned with the predetermined pattern, such that the layer comprising at least one Group VIII metal is thinner beneath the second regions than beneath the first regions. In other embodiments, the layer comprising at least one Group VIII metal is patterned with the predetermined pattern, to remove the layer comprising at least one Group VIII metal beneath the second regions.

Finally, integrated circuits may be fabricated, according to embodiments of the invention, by exposing an integrated circuit to patterned extreme ultraviolet radiation, by reflecting the extreme ultraviolet radiation from a reflection photomask that can be configured according to any of the above-described embodiments of the invention and/or may be fabricated according to any of the above-described embodiments of the invention.

DETAILED DESCRIPTION OF THE PREFERRED EMBODIMENTS

Figure 1:
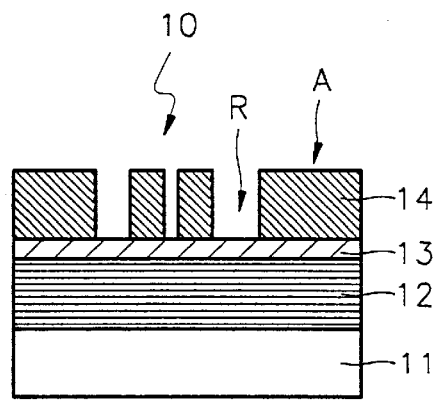
FIG. 1 is a cross-sectional view showing reflection photomasks according to embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present.

Embodiments of the present invention can stem from a realization that, when a buffer layer comprising at least one Group VIII metal is used instead of a conventional buffer layer comprising $SiO_x$ and/or SiON, or a conventional etch stop layer comprising Cr, reflection from the reflection layer need not deteriorate, even though the buffer layer may remain on the reflection layer. Moreover, high etching selectivity may be obtained relative to the reflection and/or the absorber pattern when using a buffer layer comprising at least one Group VIII metal, rather than a conventional buffer layer/etch stop layer comprising $SiO_x$, SiON and/or Cr. As is well known to those having skill in the art, the Group VIII metals consist of Fe, Ru, Os, Co, Rh, Ir, Ni, Pd and Pt.

Since it is possible to allow a buffer layer to remain on the reflection region of the photomask according to some embodiments of the invention, it is possible to stop etching before etching reaches the surface of the reflection layer during patterning of the absorber pattern. Therefore, the surface of the reflection layer need not be damaged and the reflectivity need not be reduced. Moreover, in embodiments wherein the buffer layer on the reflection region is removed, since the etching selectivity with respect to the reflection layer can be high, the surface of the reflection layer need not be damaged and the reflectivity need not be reduced.

According to some embodiments of the invention, Ru may be most suitable for the at least one Group VIII metal in the buffer layer. When Ru is used, it has been found that high etching selectivity may be obtained with respect to the material(s) that form the reflection layer. Furthermore, it has been unexpectedly found according to some embodiments of the invention, that when the Ru buffer layer remains on the reflection region, the reflectivity can actually improve when the film thickness of Ru is less than about 3 nm.

In some embodiments, when the buffer layer remains on the reflection region, the etching of the absorber may be stopped at the buffer layer, such that the buffer layer may be of uniform thickness. In other embodiments, the buffer layer on the reflection region may be over-etched. As a result, the buffer layer that is not beneath the absorber material may be thinner than the buffer layer beneath the absorber material.

Finally, when a multi-layer film, which is used in the reflection layer, is formed on a substrate, internal stress (compressive or tensile) may be generated. Some embodiments of the invention can reduce or prevent the photomask from being curved by forming a stress relaxing layer between the substrate and the reflection layer, having internal stress whose direction is inverse to the direction of the internal stress of the reflection layer. Moreover, since the difference of refractive index can be largest in the combination of an Mo film and an Si film, embodiments of the invention may employ these materials in the reflection layer.

FIG. 1 is a cross-sectional view showing reflection photomasks according to embodiments of the present invention. FIGS. 2A through 2D are cross-sectional views sequentially showing fabrication of reflection photomasks according to embodiments of the present invention. In these embodiments, a buffer layer comprising metal remains on a reflection layer. Also, in all of the figures, the thickness ratios among the respective layers are not to scale.

As shown in FIG. 1, these embodiments of reflection photomasks 10 include a reflection layer 12 that itself includes a multi-layer film comprising a plurality of alternating films comprising first and second materials, such as Mo and Si, respectively, on a substrate 11 comprising, for example, silicon and/or glass. The uppermost film of the reflection layer 12, i.e., the film that is most remote from the substrate 11, can comprise either Mo or Si. However, in some embodiments, an Si film is the uppermost film since the stability of a natural oxide film formed on the surface of Si can be high. The thickness of the Si films can be about several nm and the number of stacked layers can be about several tens.

Also, the first material can comprise Sc, Ti, V, Fe, Ni, Co, Zr, Nb, Tc, Ru, Rh, Hf, Ta, W, Re, Os, Ir, Pt, Cu, Pd, Ag, and/or Au instead of Mo. Silicon carbide, silicon nitride, silicon oxide, boron nitride, beryllium nitride, beryllium oxide, aluminum nitride and/or aluminum oxide can be used instead of silicon for the second material. The design and fabrication of a reflector layer for an extreme ultraviolet ray reflection photomask are well known to those having skill in the art and need not be described further herein.

A buffer layer 13 comprising Ru is provided on the entire surface of the reflection layer 12. An absorber pattern 14 comprising a material that is patterned in a predetermined pattern is provided on the Ru buffer layer 13. The predetermined pattern comprises first regions comprising the material that is configured to absorb extreme ultraviolet rays therein, also referred to as an absorption region A, which absorbs extreme-ultraviolet light. Second regions that are free of the material that is configured to absorb extreme ultraviolet rays therein, in which the surface of the Ru buffer layer 13 may be exposed without the absorber pattern 14, provide a reflection region R. The thickness of the Ru buffer layer 13 can be between about several nm and about several tens of mn. The buffer layer 13 also can comprise other Group VIII materials, such as Pt, Ir, and/or Pd, instead of or in addition to Ru. Thus, the buffer layer comprises a Group VIII metal.

TaN, Ta, Cr, TiN, Ti, Al-Cu, NiSi, TaSiN, TiSiN, and Al can be used as a material in the absorber pattern 14. The thickness of the absorber pattern 14 is less than 200 nm in some embodiments. The design and fabrication of an absorber pattern for an extreme ultraviolet ray reflection photomask are well known to those having skill in the art and need not be described further herein.

Figure 2A:
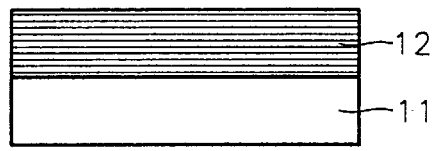
FIGS. 2A through 2D are cross-sectional views sequentially showing fabrication of reflection photomasks according to embodiments of the present invention.

Methods of fabricating a reflection type photomask 10, according to embodiments of the invention, now will be described. As shown in FIG. 2A, the reflection layer 12 comprising a Mo/Si multi-layer film is formed on the entire surface of the substrate 11, for example, by an RF magnetron sputtering method and/or an ion beam sputtering method. The sputtering conditions may change depending on the apparatus that is used. The reflection layer 12 may be formed so as to have large reflectivity in a 13.4 nm wavelength region by alternately forming the Mo film and the Si film in a period of 7 nm. In one period, the ratio of Mo is 40%, the thickness of Mo is about 2.8 nm, and the thickness of Si is about 4.2 nm. The number of layers is 81 since 40 pairs of Mo/Si are formed and Si is finally formed. However, other configurations may be used.

Figure 2B:
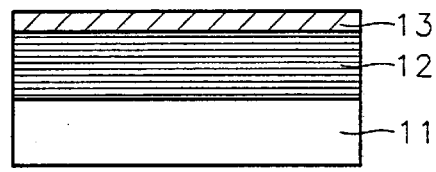

As shown in FIG. 2B, the buffer layer 13 comprising Ru is formed on the entire surface on the reflection layer 12. A DC sputtering method may be used and sputtering may be performed at an Ar gas atmosphere, where DC power is 1 kW and pressure is 0.3 Pa. Other techniques may be used.

Figure 2C:
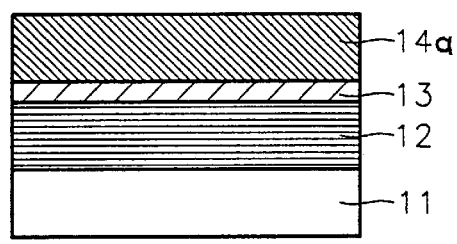

As shown in FIG. 2C, an absorber layer 14a such as tantalum nitride is formed on the entire surface on the Ru buffer layer 13. When the absorber layer 14a comprises a nitride, a reactive sputtering method may be used. In other cases, a DC sputtering or other method may be used.

Figure 2D:
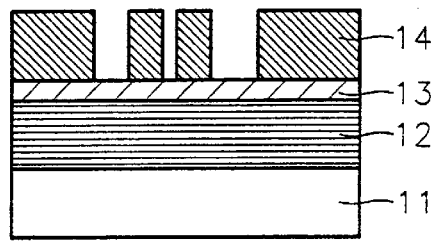

As shown in FIG. 2D, the absorber pattern 14 is formed by patterning the absorber layer 14a by photolithography. For example, after forming a resist pattern having a predetermined pattern on the absorber layer 14a, the absorber layer 14a is etched using an electron cyclotron resonance (ECR) reactive etching method. When the absorber layer 14a comprises tantalum nitride, ECR etching may be performed using the resist pattern as a mask, where a gas used is $Cl_2/Ar=80/40$ ml/min, ECR power is 600 W, RF bias power is 30 W, pressure is 5 Pa, and the temperature of a substrate is 50° C. Other conditions may be used.

In a process of etching the absorber layer 14a, when etching is stopped before the buffer layer 13 is etched, the thickness of the Ru buffer layer 13 on the reflection region can be the same as the thickness on the absorption region. See FIG. 1. When the Ru buffer layer 13 is slightly over-etched, the thickness of the Ru buffer layer 13 on the reflection region can be less than the thickness on the absorption region. See FIG. 3. Embodiments of FIG. 1 or FIG. 3 may be used.

Then, the mask is repaired using, for example, focused ion beams (FIB). The mask can be repaired using gas-assisted etching (GAE) instead of FIB. In this case, $Br_2$ can be used as etching gas. However, the etching gas can be changed according to the materials of the absorber and the buffer layer.

Figure 3:
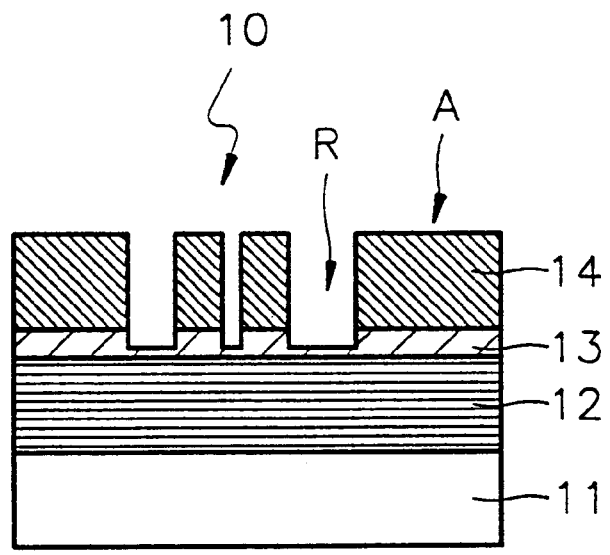
FIG. 3 is a cross-sectional view showing reflection photomasks according to other embodiments of the present invention.

According to embodiments of FIGS. 1–3, the Ru buffer layer 13 can remain on the reflection region without the need to complicate the manufacturing processes. In contrast with conventional embodiments in which two steps of etching are used, embodiments of FIGS. 1–3 can reduce or prevent the surface of the reflection layer 12 from being damaged and the reflectivity need not be reduced during the manufacturing processes.

Figure 10:
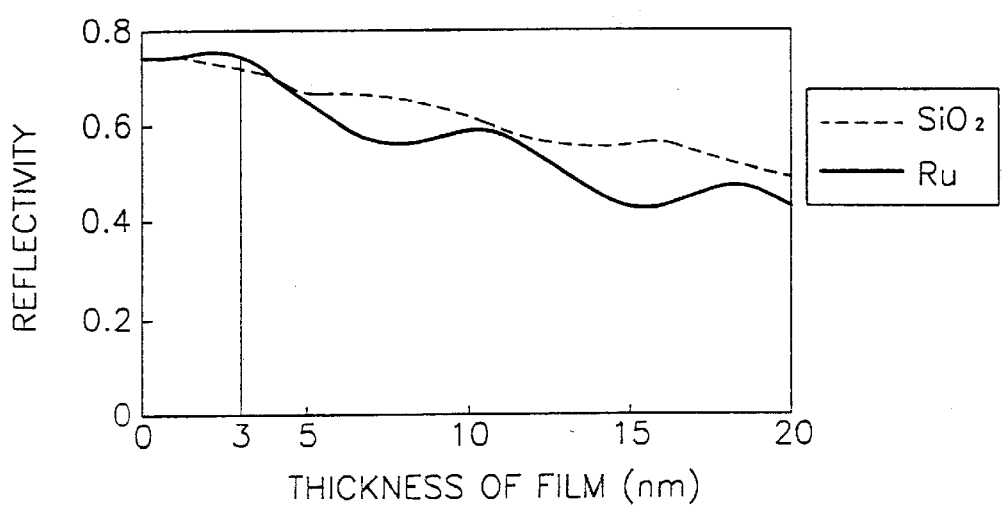
FIG. 10 graphically illustrates a simulation result showing dependency of reflectivity on the thickness of a film when $SiO_2$ is used as a conventional buffer layer and when Ru is used as a buffer layer according to embodiments of the present invention.
Figure 11:
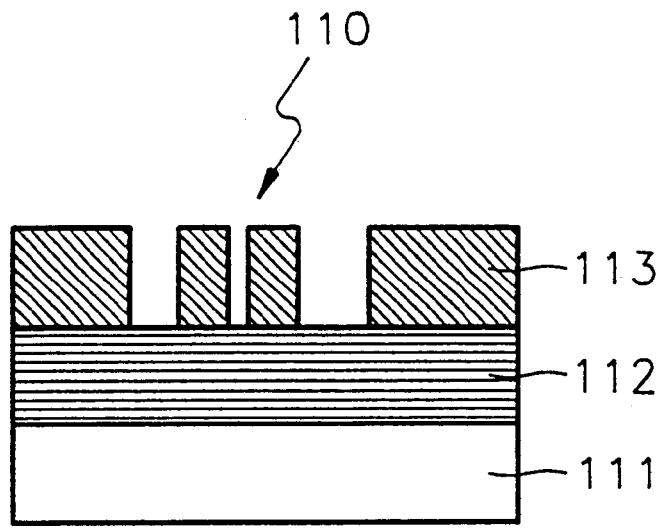
FIG. 11 is a cross-sectional view showing an example of a conventional reflection photomask.
Figure 12:
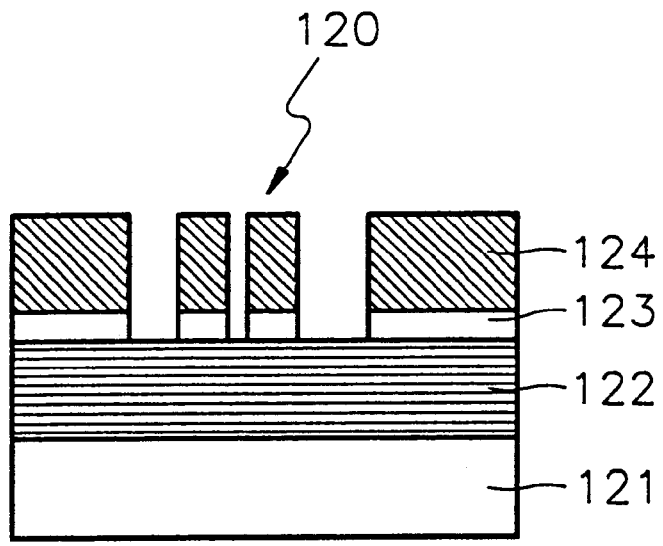
FIG. 12 is a cross-sectional view showing another example of a conventional reflection photomask.
Figure 13A:
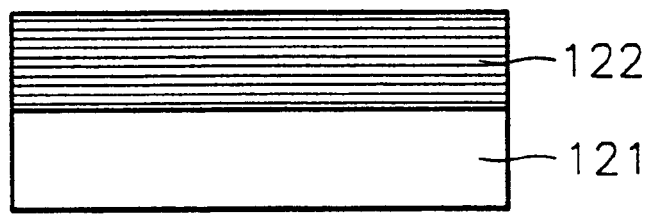
FIGS. 13A through 13F are cross-sectional views sequentially showing fabrication of a conventional reflection photomask.
Figure 13B:
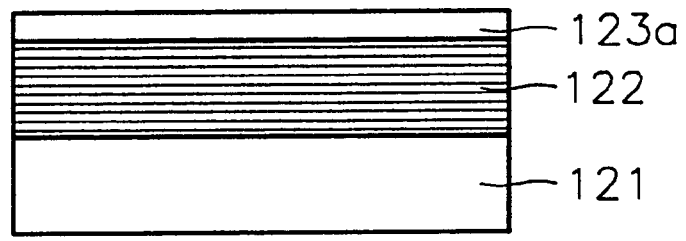
Figure 13C:
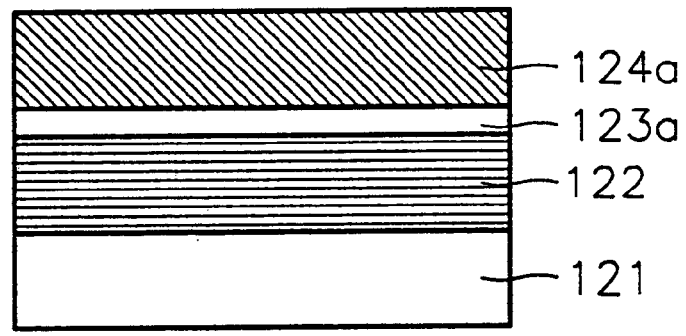
Figure 13D:
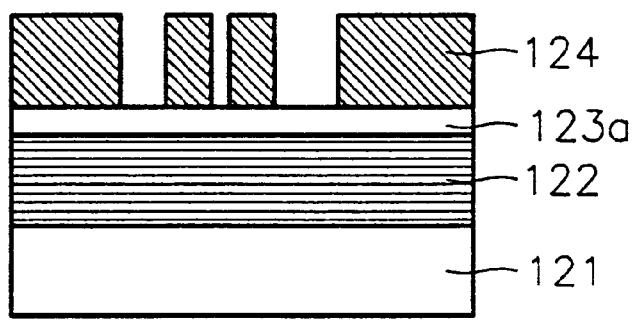
Figure 13E:
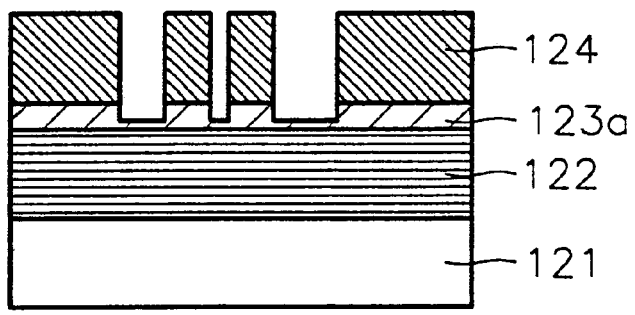
Figure 13F:
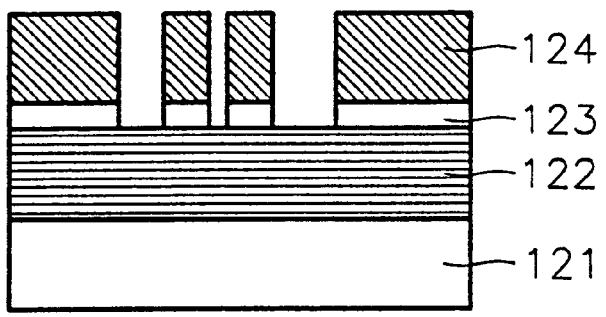
Figure 14:
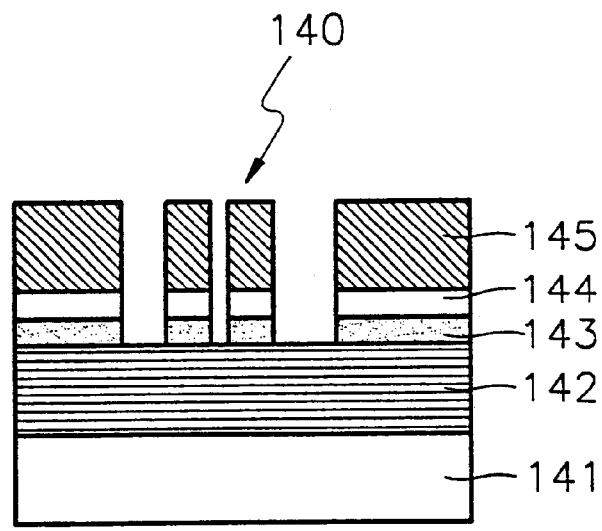
FIG. 14 is a cross-sectional view showing another example of a conventional reflection photomask.
Figure 15A:
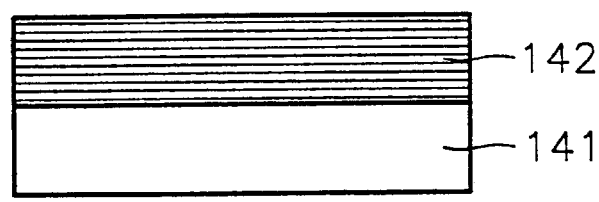
FIGS. 15A through 15G are cross-sectional views sequentially showing fabrication of a conventional reflection photomask.
Figure 15B:
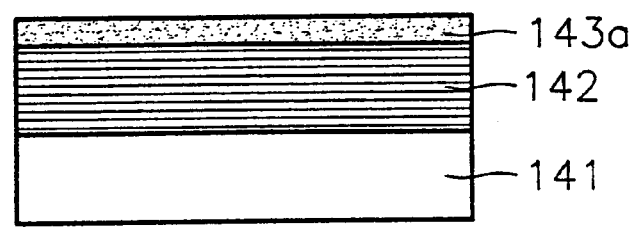
Figure 15C:
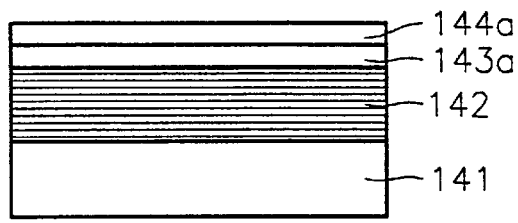
Figure 15D:
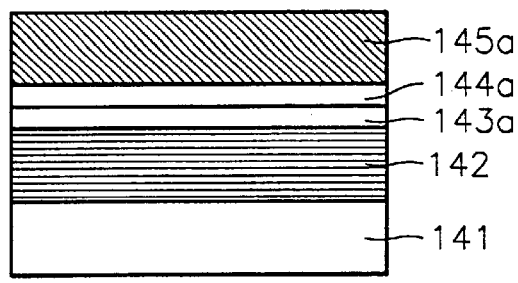
Figure 15E:
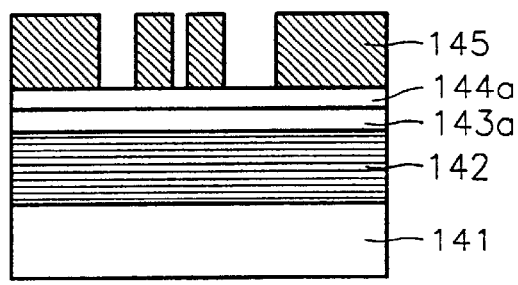
Figure 15F:
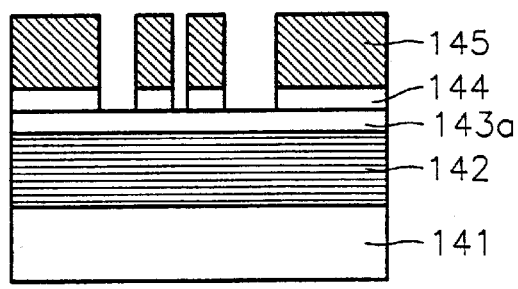
Figure 15G:
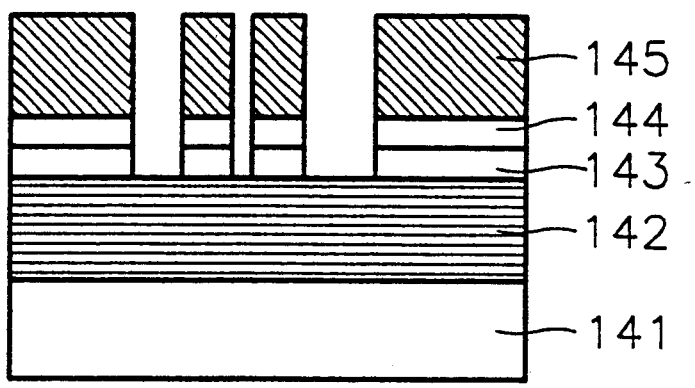
Figure 16:
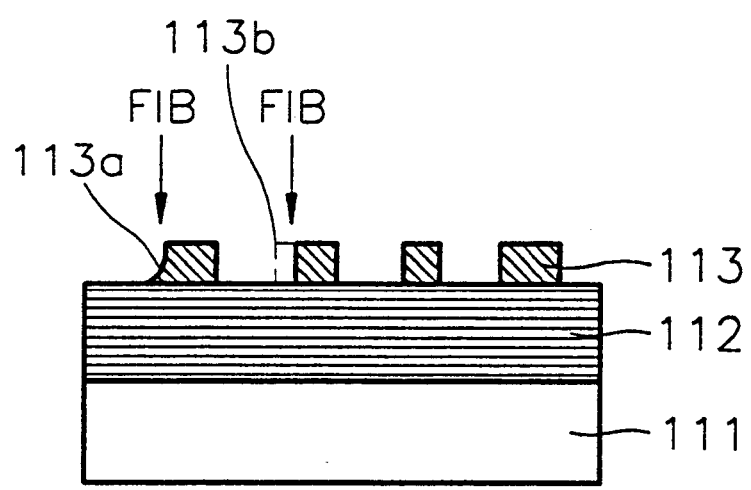
FIG. 16 is a cross-sectional view of a mask repair process.

In embodiments of FIGS. 1–3, the reflectivity may be reduced since the Ru buffer layer 13 exists on the reflection region. FIG. 10 graphically illustrates a simulation result showing dependency of reflectivity on the thickness of a buffer layer when conventional $SiO_2$ and Ru according to embodiments of the invention are used as a buffer layer. The horizontal axis denotes the thickness of the film (nm). The vertical axis denotes reflectivity. Under the simulation conditions, the buffer layer of $SiO_2$ or Ru is stacked on a multi-layer film obtained by stacking 40 pairs of Si (having the thickness of 4.14 nm)/Mo (having the thickness of 2.76 um), on which $SiO_2$ (estimated to be formed as a natural oxide film on a Si film and having the thickness of 2 nm) is formed. The wavelength of EUV radiation is 13.5 nm and the incident angle is 0°.

In the case of the $SiO_2$ buffer layer (marked with a dashed line in the drawing), the reflectivity is gradually reduced from about 0.75 as the thickness of the film increases, while the curve undulates to some extent. In the case of the Ru buffer layer (marked with a solid line in the drawing), the wave of the curve is larger than in the case of $SiO_2$ and the reflectivity actually improves compared to the case where the buffer layer does not exist, when the film thickness (t) is $0<t\leq3$ nm. Therefore, when the Ru buffer layer remains, and the reflectivity can be reduced by up to 10%, the film thickness can be estimated to be about 6 nm. Accordingly, it is possible to appropriately set the film thickness corresponding to desired reflectivity in a manufactured photomask. Moreover, as mentioned above, unexpectedly, when the thickness of the Ru buffer layer is less than about 3 nm, the reflectivity actually can be increased compared to absence of the buffer layer.

Figure 4:
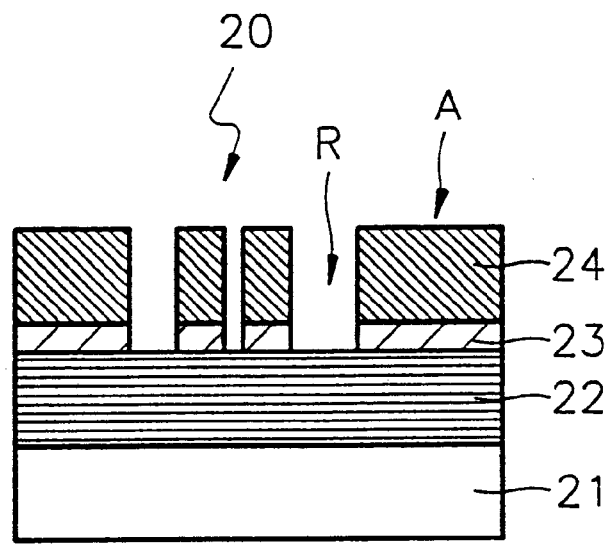
FIG. 4 is a cross-sectional view showing reflection photomasks according to other embodiments of the present invention.
Figure 5A:
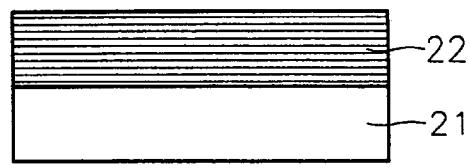
FIGS. 5A through 5E are cross-sectional views sequentially showing fabrication of reflection photomasks according to other embodiments of the present invention.

FIG. 4 is a cross-sectional view showing reflection photomasks according to other embodiments of the present invention. FIGS. 5A–5E are cross-sectional views of fabrication methods of reflection photomasks according to other embodiments of the present invention. In FIGS. 4–5E, the buffer layer does not remain on the reflection region.

As shown in FIG. 4, these embodiments of reflection photomasks 20 include a reflection layer 22 comprising, for example, a Mo/Si multi-layer film on a substrate 21 comprising, for example silicon and/or glass. The uppermost layer of the reflection layer 22 can be the same as shown in FIGS. 1–3. The thickness of the Mo/Si layer and/or the number of layers can be the same as shown in FIGS. 1–3. Alternatively, other configurations may be used.

A patterned buffer layer 23 comprising Ru having a predetermined pattern is provided on the reflection layer 22. An absorber pattern 24 having the predetermined pattern of the Ru buffer layer 23 is provided on the Ru buffer layer 23. A first region covered with the absorber pattern 24 in the reflection type photomask 20 provides an absorption region A. A second region, in which the absorber pattern 24 and the Ru buffer layer 23 do not exist and the surface of the reflection layer 22 is exposed, provides a reflection region R. The compositions of the buffer layer 23 and the thickness of the buffer layer 23 can be as shown in FIGS. 1–3. The material and thickness of the absorber pattern 24 also can be as shown in FIGS. 1–3. However, different thicknesses/materials can be used.

Methods for fabricating reflection photomasks 20 according to other embodiments of the invention, now will be described. As shown in FIG. 5A, the reflection layer 22 comprising a Mo/Si multi-layer film is formed on the entire surface of the substrate 21, for example, by an RF magnetron sputtering method and/or an ion beam sputtering method. The sputtering conditions may change according to the apparatus that is used. The reflection layer 22 may be formed so as to have large reflectivity in a 13.4 nm wavelength region by alternately forming the Mo film and the Si film in a period of 7 nm. In one period, the ratio of Mo is 40%, the thickness of Mo is about 2.8 nm, and the thickness of Si is about 4.2 nm. The number of layers is 81 since 40 pairs of Mo/Si are formed and Si is finally formed. However, other configurations may be used.

Figure 5B:
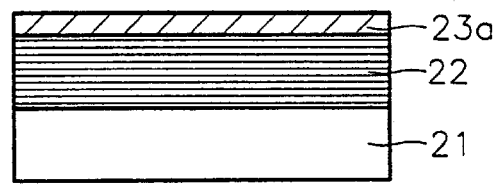

As shown in FIG. 5B, a buffer layer 23a comprising Ru is formed on the entire surface on the reflection layer 22. A DC sputtering method may be used and sputtering may be performed at an Ar gas atmosphere, where DC power is 1 kW and pressure is 0.3 Pa. Other techniques may be used.

Figure 5C:
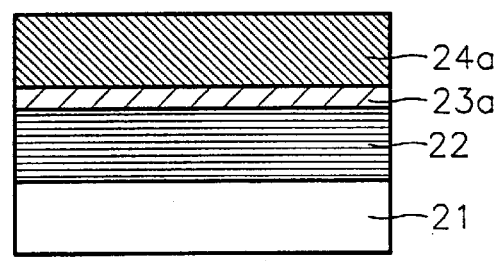

As shown in FIG. 5C, an absorber layer 24a such as tantalum nitride is formed on the entire surface on the Ru buffer layer 23a. When the absorber layer 24a is formed of a nitride, a reactive sputtering method may be used. In other cases, a DC sputtering or other method may be used.

Figure 5D:
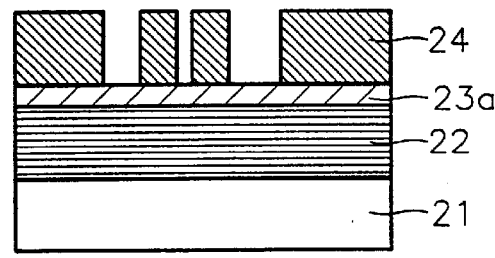
Figure 5E:
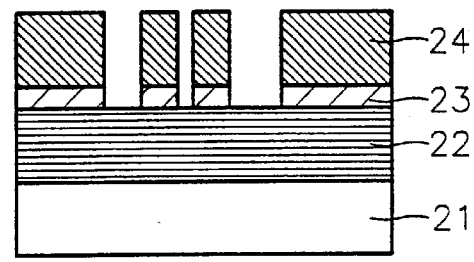

As shown in FIG. 5D, the absorber pattern 24 is formed by patterning the absorber layer 24a by photolithography. For example, after forming a resist pattern having a predetermined pattern on the absorber layer 24a, an electron cyclotron resonance (ECR) reactive etching method may be used using the resist pattern as a mask. When the absorber layer 24a comprises tantalum nitride, ECR etching may be performed where a gas used is $Cl_2/Ar=80/40$ ml/min, ECR power is 600 W, RF bias power is 30 W, pressure is 5 Pa, and the temperature of a substrate is 50° C., at least until the surface of the Ru buffer layer 23a is exposed. Other conditions may be used. In the present embodiments, since the Ru buffer layer 23a is etched later, the Ru buffer layer 23a can be over-etched. The mask may be repaired using focused ion beams (FIB).

As shown in FIG. 5E, the Ru buffer layer 23a then is etched using the absorber pattern 24 as a mask. In embodiments of FIG. 5E, little or no damage to the surface of the reflection layer 22 may be produced during the etching of the Ru buffer layer 23a. In some embodiments, a dry etching apparatus of an ECR method is used. When the Ru buffer layer is actually etched, where the gas used is $Cl_2/O_2$ (the amount of $Cl_2$ is 30%), the ECR power is 300 W, the RF bias power is 30 W, and the temperature of a substrate is 50° C., it is possible to obtain high etching selectivity of 19.3:1 with respect to amorphous silicon (the uppermost layer of the reflection layer) formed by the sputtering method.

The etching selectivity of TaN, which can form the absorber, with respect to $SiO_2$, which can form the conventional buffer layer, now will be compared with the etching selectivity of TaN with respect to Ru, which can be used in embodiments of the present invention. In particular, when the etching is performed, where the gas used is $Cl_2/Ar$ =80/40 ml/min, the ECR power is 600 W, the RF bias power is 30 W, the pressure is 5 Pa, and the temperature of a substrate is 50° C., etching selectivities of TaN with respect to $SiO_2$ of 8:1 and with respect to Ru of 30:1 are obtained.

Thus, according to embodiments of FIGS. 4–5E, it is possible to control the over-etching of the surface of the reflection layer 22 and to reduce or prevent the reflectivity from deteriorating by controlling the etching conditions even though the Ru buffer layer 23a on the reflection region is etched and removed.

Figure 6:
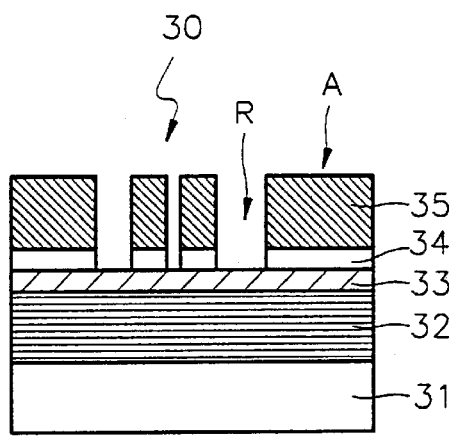
FIG. 6 is a cross-sectional view showing reflection photomasks according to other embodiments of the present invention.

FIG. 6 is a cross-sectional view showing reflection photomasks according to other embodiments of the invention. FIGS. 7A–7F are cross-sectional views illustrating fabrication of reflection photomasks according to other embodiments of the invention. In these embodiments, a second semiconductor material-based buffer layer is formed on a first buffer layer comprising at least one Group VIII metal.

Referring to FIG. 6, these embodiments of the present invention can provide reflective photomasks 30 that comprise a reflection layer 32 comprising, for example, a Mo/Si multi-layer film, on a substrate 31 comprising, for example, silicon and/or glass. The uppermost layer of the reflection layer 32 can be the same as already described. The thickness of Mo/Si layers and/or the number of stacked layers can be the same as was already described. Alternatively, different configurations may be used.

A first buffer layer 33 comprising Ru is provided on the entire surface of the reflection layer 32. A second buffer layer 34 having a predetermined pattern is provided on the first Ru buffer layer 33. An absorber pattern 35 is provided on the second buffer layer 34. A first region covered with the absorber pattern 35 in the reflection type photomask 30 provides an absorption region A. A second region, in which the absorber pattern 35 and the second buffer layer 34 do not exist and the surface of the first buffer layer 33 is exposed, provides a reflection region R. The material of the first buffer layer 33 and/or the thickness of the first buffer layer 33 may be as already described. The second buffer layer 34 can comprise a silicon oxide film, a silicon nitride film, and/or a silicon oxynitride film. In some embodiments, the thickness of the second buffer layer 34 is preferably between about several tens and about 100 nm. The material and thickness of the absorber pattern 35 can be as was described above.

Methods for fabricating the reflection photomasks 30 according to these embodiments of the invention now will be described.

Figure 7A:
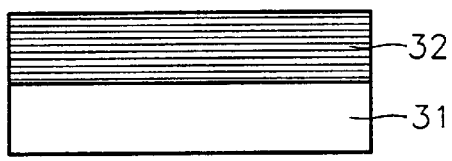
FIGS. 7A through 7F are cross-sectional views sequentially showing fabrication of reflection photomasks according to other embodiments of the present invention.

As shown in FIG. 7A, the reflection layer 32 comprising a Mo/Si multi-layer film is formed on the entire surface of the substrate 31, for example by an RF magnetron sputtering method and/or an ion beam sputtering method. The sputtering conditions may change according to the apparatus that is used. The reflection layer 32 may be formed so as to have large reflectivity in a 13.4 nm wavelength region by alternately forming the Mo film and the Si film in a period of 7 nm. In one period, the ratio of Mo is 40%, the thickness of Mo is about 2.8 nm, and the thickness of Si is about 4.2nm. The number of layers is 81 since 40 pairs of Mo/Si are formed and Si is finally formed. However, other configurations may be used.

Figure 7B:
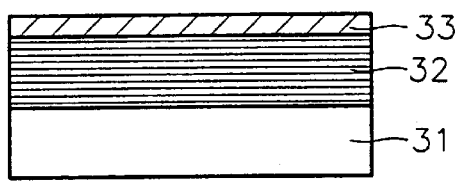

As shown in FIG. 7B, the first buffer layer 33 comprising Ru is formed on the entire surface on the reflection layer 32. A DC sputtering method may be used and sputtering may be performed at an Ar gas atmosphere, in which DC power is 1 kW and pressure is 0.3 Pa.

Figure 7C:
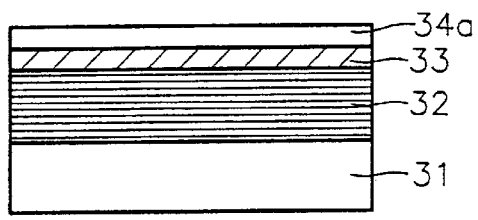

As shown in FIG. 7C, a second buffer layer 34a comprising silicon oxide is formed on the entire surface on the first buffer layer 33. Since low temperature deposition may be advantageous in order to reduce or minimize the change of the reflectivity of the reflection layer, a sputtering method or a plasma CVD method can be used. During the low temperature deposition, the RF sputtering method may be used in the case of silicon oxide and the plasma CVD method may be used in the case of silicon oxynitride.

Figure 7D:
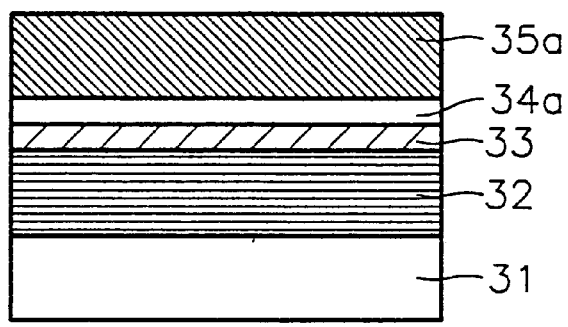

As shown in FIG. 7D, an absorber layer 35a comprising tantalum nitride is formed on the entire surface of the second buffer layer 34a. When the absorber layer 35a comprises nitride, a reactive sputtering method may be used. In the other cases, a DC sputtering or other method may be used.

Figure 7E:
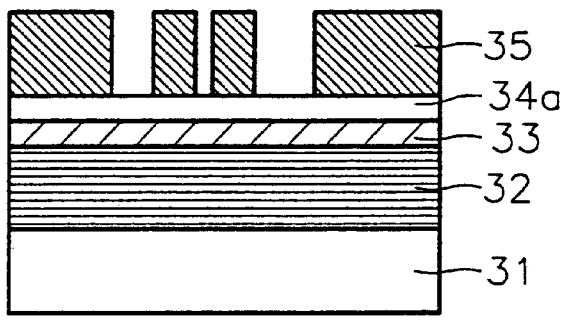

As shown in FIG. 7E, the absorber pattern 35 is formed by patterning the absorber layer 35a by photolithography. For example, after forming a resist pattern having a predetermined pattern on the absorber layer 35a, the absorber layer 35a is etched at least until the surface of the second buffer layer 34a is exposed, using an electron cyclotron resonance (ECR) reactive etching method. For example, when the absorber layer 35a comprises tantalum nitride, using the resist pattern as a mask, an ECR method may be used where a gas used is $Cl_2/Ar$ 80/40 ml/min, ECR power is 600 W, RF bias power is 30 W, pressure is 5 Pa, and the temperature of a substrate is 50° C. Then, the mask may be repaired using focused ion beams (FIB).

Figure 7F:
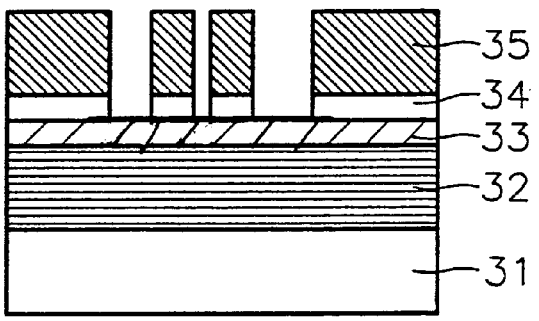
Figure 8:
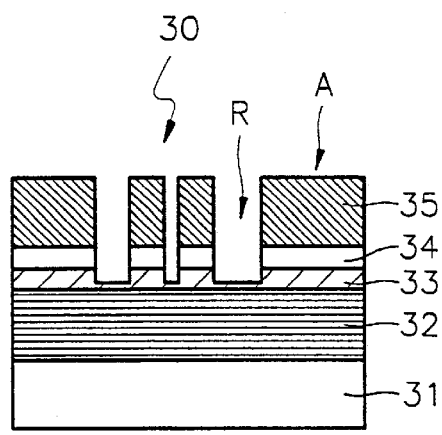
FIG. 8 is a cross-sectional view showing reflection photomasks according to other embodiments of the present invention.

As shown in FIG. 7F, the second buffer layer 34a is etched using the absorber pattern 35 as the mask. When the second buffer layer 34a comprises silicon oxide, the second buffer layer 34a is etched at least until the surface of the first buffer layer 33 is exposed using, for example, the ECR method, where a gas used is Ar/C$_4$F$_8$/O$_2$=200/10/20 ml/min, ECR power is 600 W, RF bias power is 15 W, pressure is 1 Pa, and the temperature of a substrate is 50° C. Also, when the second buffer layer 34a comprises silicon oxynitride, it is possible to etch the second buffer layer 34a using an etching gas in the fluorine family. In the etching process, the first buffer layer 33 can operate as an etch stop. Thus, the etching rate can be more than 70 nm/min with respect to a silicon oxide film when Ar/C$_4$F$_8$/O$_2$ is used as an etching gas. It was confirmed that only an extremely small amount of the Ru film, which could not be measured, was etched, so that the Ru film operates as an etch stop. According to the etching condition, as shown in FIG. 8, the surface of the first buffer layer 33 may be slightly etched and the thickness of the first buffer layer 33 in the reflection region may less than in the absorption region. Reflection photomasks 30 then are completed as was already described.

According to embodiments of FIGS. 6–8, the first Ru buffer layer 33 can remain on the reflection region without the need to complicate the manufacturing processes. In contrast, in conventional embodiments, two-stage etching is used. being damaged and the reflectivity need not be reduced during the manufacturing processes, as was described in connection with FIGS. 1–3.

Although the reflectivity may be reduced since the first Ru buffer layer 33 can remain on the reflection region, it is possible to prevent the reflectivity from deteriorating by controlling the thickness of the first Ru buffer layer 33. As was already described, the thickness of the first Ru buffer layer 33 can be less than about 3 nm, so that the reflectivity actually can be increased compared to absence of the buffer layer.

Figure 9:
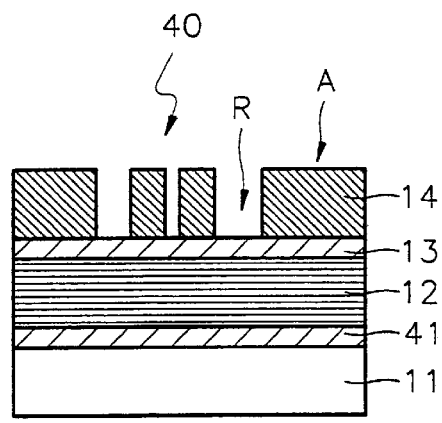
FIG. 9 is a cross-sectional view showing reflection photomasks according to other embodiments of the present invention.

FIG. 9 is a cross-sectional view showing other reflection photomasks according to embodiments of the present invention. The structure of the reflection type photomask 40 of FIG. 9 is the same as the structure shown in FIG. 1, except that a stress relaxing layer 41 is added between the substrate 11 and the reflection layer 12. Therefore, the same reference numerals in FIGS. 1 and 9 represent the same elements, and detailed description of these elements will not be repeated.

As shown in FIG. 9, the stress relaxing layer 41 is provided on the substrate 11 comprising, for example, silicon and/or glass, and a reflection layer 12 comprising, for example, an Mo/Si multi-layer film is provided on the stress relaxing layer 41. The Ru buffer layer 13 is provided on the reflection layer 12 and the absorber pattern 14 is provided on the Ru buffer layer. The stress relaxing layer 41 can comprise Ru and Mo.

In embodiments of FIG. 9, it is possible to prevent the surface of the reflection layer from being damaged and the reflectivity need not be reduced during the manufacturing processes, without the need to complicate the fabrication processes. These effects were described above and will not be repeated. Furthermore, in embodiments of FIG. 9, the direction of the internal stress of the reflection layer 12 comprising the Mo/Si multi-layer film, is opposite to the direction of the internal stress of the stress relaxing layer 41 comprising a single layer such as Ru and/or Mo. Thus, the internal stress of the reflection layer 12 can be offset and relaxed and it is possible to reduce or prevent the photomask from bending.

Also, this invention may be embodied in many different forms without departing from the spirit and scope of the invention as defined by the appended claims and should not be construed as being limited to the above forms of embodiments. For example, in the manufacturing processes described above, various detailed processing conditions such as the materials and thicknesses of the respective embodiments are only an example and can be appropriately changed.

As mentioned above, reflection photomasks according to embodiments of the present invention can allow uncomplicated fabrication and/or can prevent the surface of the reflection layer from being damaged and the reflectivity from being reduced during the manufacturing processes. Accordingly, reflection photomasks according to embodiments of the present invention can be suitable for fine processing using the EUV region.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A reflection photomask, comprising:
   a substrate;
   a reflection layer comprising a plurality of alternating films comprising first and second materials, respectively, on the substrate;
   a buffer layer comprising at least one Group VIII metal, on the reflection layer opposite the substrate; and
   an absorber pattern comprising material that is patterned in a predetermined pattern and that is configured to absorb extreme ultraviolet rays therein, on the buffer layer opposite the reflection layer.

2. A reflection photomask according to claim 1 wherein the at least one Group VIII metal comprises Ru.

3. A reflection photomask according to claim 2 wherein at least a portion of the buffer layer comprising Ru is less than about 3 nm thick.

4. A reflection photomask according to claim 1 wherein the at least one Group VIII metal comprises at least one of Pt, ft and Pd.

5. A reflection photomask according to claim 1 wherein the first and second materials comprise Mo and Si.

6. A reflection photomask according to claim 1 further comprising a stress relaxing layer between the substrate and the reflection layer.

7. A reflection photomask according to claim 1 wherein the predetermined pattern comprises first regions comprising the material that is configured to absorb extreme ultraviolet rays therein and second regions that are free of the material that is configured to absorb extreme ultraviolet rays therein and wherein the buffer layer is thinner beneath the second regions than beneath the first regions.

8. A reflection photomask according to claim 1 wherein the buffer layer comprises a patterned buffer layer that is patterned in the predetermined pattern.

9. A reflection photomask according to claim 1 wherein the buffer layer is a first buffer layer, the reflection photomask further comprising:
   a second buffer layer between the first buffer layer and the absorber pattern and that is patterned in the predetermined pattern.

10. A reflection photomask according to claim 9 wherein the first buffer layer comprises a patterned first buffer layer that is patterned in the predetermined pattern.

11. A reflection photomask according to claim 9 wherein the predetermined pattern comprises first regions comprising the material that is configured to absorb extreme ultraviolet rays therein and second regions that are free of the material that is configured to absorb extreme ultraviolet rays therein and wherein the first buffer layer is thinner beneath the second regions than beneath the first regions.

12. A reflection photomask according to claim 1, further comprising an etch stop prior to the absorber pattern.

13. A reflection photomask, comprising:
   a substrate;
   a reflection layer that is configured to reflect extreme ultraviolet rays, on the substrate;
   a buffer layer comprising at least one Group VIII metal, on the reflection layer opposite the substrate; and
   an absorber pattern comprising material that is patterned in a predetermined pattern and that is configured to absorb extreme ultraviolet rays therein, on the buffer layer opposite the reflection layer.

14. A reflection photomask according to claim 13 wherein the at least one Group VIII metal comprises Ru.

15. A reflection photomask according to claim 14 wherein at least a portion of the buffer layer comprising Ru is less than about 3 nm thick.

16. A reflection photomask according to claim 13 wherein the at least one Group VIII metal comprises at least one of Pt, Ir and Pd.

17. A reflection photomask according to claim 13 further comprising a stress relaxing layer between the substrate and the reflection layer.

18. A reflection photomask according to claim 13 wherein the predetermined pattern comprises first regions comprising the material that is configured to absorb extreme ultraviolet rays therein and second regions that are free of the material that is configured to absorb extreme ultraviolet rays therein and wherein the buffer layer is thinner beneath the second regions than beneath the first regions.

19. A reflection photomask according to claim 13 wherein the buffer layer comprises a patterned buffer layer that is patterned in the predetermined pattern.

20. A reflection photomask according to claim 13 wherein the buffer layer is a first buffer layer, the reflection photomask further comprising:
   a second buffer layer between the first buffer layer and the absorber pattern and that is patterned in the predetermined pattern.

21. A reflection photomask according to claim 20 wherein the first buffer layer comprises a patterned first buffer layer that is patterned in the predetermined pattern.

22. A reflection photomask according to claim 20 wherein the predetermined pattern comprises first regions comprising the material that is configured to absorb extreme ultraviolet rays therein and second regions that are free of the material that is configured to absorb extreme ultraviolet rays therein and wherein the first buffer layer is thinner beneath the second regions than beneath the first regions.

23. A reflection photomask according to claim 13, further comprising an etch stop prior to the absorber pattern.

24. A photomask, comprising:
   a substrate;
   a first layer comprising a plurality of alternating films comprising Mo and Si, respectively, on the substrate;
   a second layer comprising at least one Group VIII metal, on the first layer opposite the substrate; and
   an absorber pattern comprising material that is patterned in a predetermined pattern and that is configured to absorb extreme ultraviolet rays therein, on the second layer opposite the first layer.

25. A photomask according to claim 24 wherein the at least one Group VIII metal comprises Ru.

26. A photomask according to claim 25 wherein at least a portion of the second layer comprising Ru is less than about 3 nm thick.

27. A photomask according to claim 24 wherein the at least one Group VIII metal comprises at least one of Pt, Ir and Pd.

28. A photomask according to claim 24 further comprising a layer comprising Ru and Mo between the substrate and the first layer.

29. A photomask according to claim 24 wherein the predetermined pattern comprises first regions comprising the material that is configured to absorb extreme ultraviolet rays therein and second regions that are free of the material that is configured to absorb extreme ultraviolet rays therein and wherein the second layer is thinner beneath the second regions than beneath the first regions.

30. A photomask according to claim 24 wherein the second layer comprises a patterned second layer that is patterned in the predetermined pattern.

31. A photomask according to claim 24 further comprising:
   a third layer between the second layer and the absorber pattern and that is patterned in the predetermined pattern.

32. A photomask according to claim 31 wherein the second layer comprises a patterned second layer that is patterned in the predetermined pattern.

33. A photomask according to claim 31 wherein the predetermined pattern comprises first regions comprising the material that is configured to absorb extreme ultraviolet rays therein and second regions that are free of the material that is configured to absorb extreme ultraviolet rays therein and wherein the second layer is thinner beneath the second regions than beneath the first regions.

34. A photomask according to claim 24, further comprising an etch stop prior to the absorber pattern.

35. A method of fabricating a reflection photomask, comprising:
   forming a plurality of alternating films comprising first and second materials, respectively, on a substrate;
   forming a layer comprising at least one Group VIII metal, on the plurality of alternating films comprising first and second materials opposite the substrate;
   forming a layer comprising material that is configured to absorb extreme ultraviolet rays therein, on the layer comprising at least one Group VIII metal, opposite the plurality of alternating films comprising first and second materials; and
   patterning the layer comprising material that is configured to absorb extreme ultraviolet rays therein.

36. A method according to claim 35 wherein the at least one Group VIII metal comprises Ru.

37. A method according to claim 36 wherein at least a portion of the Ru is less than about 3 nm thick.

38. A method according to claim 35 wherein the at least one Group VIII metal comprises at least one of Pt, Ir and Pd.

39. A method according to claim 35 wherein the first and second materials comprise Mo and Si.

40. A method according to claim 35:
   wherein the patterning comprises patterning the layer comprising material that is configured to absorb extreme ultraviolet rays therein into a predetermined pattern including first regions comprising the material that is configured to absorb extreme ultraviolet rays therein and second regions that are free of the material that is configured to absorb extreme ultraviolet rays therein;

the method further comprising patterning the layer comprising at least one Group VIII metal with the predetermined pattern such that the layer comprising at least one Group VIII metal is thinner beneath the second regions than beneath the first regions.

41. A method according to claim 35:

wherein the patterning comprises patterning the layer comprising material that is configured to absorb extreme ultraviolet rays therein into a predetermined pattern including first regions comprising the material that is configured to absorb extreme ultraviolet rays therein and second regions that are free of the material that is configured to absorb extreme ultraviolet rays therein:

the method further comprising patterning the layer comprising at least one Group VIII metal with the predetermined pattern to remove the layer comprising at least one Group VIII metal beneath the second regions.

42. A method according to claim 35 wherein the following is performed between the forming a layer comprising at least one Group VIII metal and the forming a layer comprising material that is configured to absorb extreme ultraviolet rays:

forming a second layer on the layer comprising at least one Group VIII metal; and wherein the patterning is followed by patterning the second layer with the predetermined pattern.

43. A method according to claim 42 wherein the patterning the second layer is followed by:

patterning the layer comprising at least one Group VIII metal with the predetermined pattern.

44. A method according to claim 35, wherein said patterning is performed until at least a portion of the layer comprising at least one Group VIII metal is exposed.

45. A method of fabricating an integrated circuit comprising:

exposing an integrated circuit to patterned extreme ultraviolet radiation by reflecting the extreme ultraviolet radiation from a reflection photomask that includes a substrate; a reflection layer comprising a plurality of alternating films comprising first and second materials, respectively, on the substrate; a buffer layer comprising at least one Group VIII metal, on the reflection layer opposite the substrate; and an absorber pattern comprising material that is patterned in a predetermined pattern and that is configured to absorb extreme ultraviolet rays therein, on the buffer layer opposite the reflection layer.

46. A method according to claim 45 wherein the metal comprises Ru.

47. A method according to claim 46 wherein at least a portion of the buffer layer comprising Ru is less than about 3 nm thick.

48. A method according to claim 45 wherein the at least one Group VIII metal comprises at least one of Pt, Ir and Pd.

49. A method according to claim 45 wherein the first and second materials comprise Mo and Si.

50. A method according to claim 45 wherein the reflection photomask further comprises a stress relaxing layer between the substrate and the reflection layer.

51. A method according to claim 45 wherein the predetermined pattern comprises first regions comprising the material that is configured to absorb extreme ultraviolet rays therein and second regions that are free of the material that is configured to absorb extreme ultraviolet rays therein and wherein the buffer layer is thinner beneath the second regions than beneath the first regions.

52. A method according to claim 45 wherein the buffer layer comprises a patterned buffer layer that is patterned in the predetermined pattern.

53. A method according to claim 45 wherein the buffer layer is a first buffer layer, the reflection photomask further comprising:

a second buffer layer between the first buffer layer and the absorber pattern and that is patterned in the predetermined pattern.

54. A method according to claim 53 wherein the first buffer layer comprises a patterned first buffer layer that is patterned in the predetermined pattern.

55. A method according to claim 53 wherein the predetermined pattern comprises first regions comprising the material that is configured to absorb extreme ultraviolet rays therein and second regions that are free of the material that is configured to absorb extreme ultraviolet rays therein and wherein the first buffer layer is thinner beneath the second regions than beneath the first regions.

56. A method according to claim 45, wherein at least a portion of the buffer layer is exposed during the patterning of the absorber layer.

* * * * *

UNITED STATES PATENT AND TRADEMARK OFFICE
CERTIFICATE OF CORRECTION

PATENT NO. : 6,699,625 B1
DATED : March 2, 2004
INVENTOR(S) : Lee et al.

It is certified that error appears in the above-identified patent and that said Letters Patent is hereby corrected as shown below:

<u>Title page,</u>
Item [75], Inventor, should read -- Eiichi Hoshino --

<u>Column 12,</u>
Line 41, should read -- Pt, Ir and Pd. --

Signed and Sealed this

Sixth Day of July, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,699,625 B2
DATED : March 2, 2004
INVENTOR(S) : Byoung-taek Lee et al.

It is certified that error appears in the above-identified patent and that said Letters Patent is hereby corrected as shown below:

<u>Title page,</u>
Item [73], Assignee, add the following:
-- Hitachi, Ltd. (JP) --.

Signed and Sealed this

Ninth Day of May, 2006

JON W. DUDAS
*Director of the United States Patent and Trademark Office*